United States Patent [19]

Port et al.

[11] Patent Number: 5,319,680
[45] Date of Patent: Jun. 7, 1994

[54] PHASE LOCKED LOOP SYNCHRONIZATION SYSTEM FOR USE IN DATA COMMUNICATIONS

[75] Inventors: Adrian G. Port, Lansdale; Charles D. Spackman, Chester Springs, both of Pa.

[73] Assignee: The Whitaker Corporation, Wilmington, Del.

[21] Appl. No.: 753,704

[22] Filed: Sep. 3, 1991

[51] Int. Cl.[5] .............................................. H03D 3/24
[52] U.S. Cl. ................................. 375/119; 375/120; 331/2
[58] Field of Search ................. 375/119, 120, 110; 328/155; 360/38.1, 39; 331/12, 18, 25, 1 R, 2; 307/231, 511, 514

[56] References Cited

U.S. PATENT DOCUMENTS

| | | |
|---|---|---|
| 4,282,493 | 8/1981 | Moreau . |
| 4,291,332 | 9/1981 | Kato et al. ........................ 375/120 |
| 4,388,597 | 6/1983 | Bickley et al. . |
| 4,451,930 | 5/1984 | Chapman et al. . |
| 4,519,086 | 5/1985 | Hull et al. ........................ 375/120 |
| 4,569,017 | 2/1986 | Renner et al. . |
| 4,584,643 | 4/1986 | Halpern et al. . |
| 4,590,602 | 5/1986 | Wolaver ........................... 375/120 |
| 4,633,298 | 12/1986 | Steckler et al. . |
| 4,787,097 | 11/1988 | Rizzo ............................... 375/120 |
| 4,943,788 | 7/1990 | Laws et al. ....................... 375/120 |

OTHER PUBLICATIONS

GigaBit Logic, "Phase/Frequency Comparator 1 GHz Input Frequency" 16G044 Mar. 1987.
Western Digital Imaging "Video Graphics Array Clock" WD90C60 Dec. 8, 1989.
Integrated Circuit Systems, Inc., "Video Dot Clock Generator" ICS1495.
Avasem Corp. "Dual, Video Frequency Generator", AV9114.

Primary Examiner—Stephen Chin
Assistant Examiner—Tesfaldet Bocure
Attorney, Agent, or Firm—Ratner & Prestia

[57] ABSTRACT

A clock generator uses coarse and fine phase locking to lock an internal clock signal to an intermittently received data signal. The clock generator uses separate coarse and fine phase locked loops (PLL's). The respective voltage controlled oscillators (VCO's) of the PLL's are made from matched components and the coarse control signal is applied to both VCO's. The fine PLL locks the output signal provided by the second PLL in phase to the received data signal. The oscillatory signal provided by the second PLL is the output clock signal of the system. The fine phase control signal is combined with the coarse frequency control signal to generate the control signal for the second VCO. The fine phase control signal is generated by comparing transitions in a non-return to zero (NRZ) encoded data signal to corresponding transitions in the output clock signal. Phase correction errors made due to missing transitions in the encoded data signal are compensated by one type of phase detector which retains the previous levels of the received data signals. Another type of phase detector gates the clock signal into the loop filter only when it is coincident with detected transitions in the received data signal.

10 Claims, 11 Drawing Sheets

PHASE LOCKED LOOP SYNCHRONIZATION SYSTEM FOR USE IN DATA COMMUNICATIONS

BACKGROUND OF THE INVENTION

The present invention relates generally to phase locked loop (PLL) circuitry and in particular to a frequency agile PLL system which generates a clock signal that is synchronized to signal transitions occurring in a received data stream.

In a data communications system, multiple data processing systems transmit data to, and receive data from each other over a shared network. Generally, the network includes a number of interconnected nodes, each having a respective clock signal generator. The data transmitted by each node is synchronized to the clock signal provided by its clock signal generator.

In order to receive data, however, a node cannot use its own clock signal unless steps are taken to synchronize the incoming data stream with the local clock signal. If the receiving clock signal is not synchronized to the incoming data in both frequency and phase, the data may not be received properly.

Consider, for example, the data communications network shown in FIG. 1. In this FIGURE, three network transceivers, 110, 122 and 130 are connected in a daisy-chain configuration. The transceivers 110, 122 and 130 are coupled to respective host processors 116, 126 and 134. This may represent, for example, a portion of a ring data communications network. The transceivers 110, 122 and 130 have respective clock oscillators 112, 124 and 132, Which produce respective local clock signals used by the transceivers, and the host processors 116, 126 and 134 have respective clock oscillators 118, 128 and 136 Which produce the clock signals that are used by the host processors.

In normal operation, transceiver 110 receives and sends data over the network on behalf of the host processor 116. Data, destined for the host 116 which is received from the network by transceiver 110 is forwarded to the host processor 116 over the bidirectional data link DL. Data to be sent over the network from the host processor 116 to, for example, the host processor 126 is provided to the transceiver 110 via the data link DL.

If the host processor properly receives a message from the transceiver 110, it sends an acknowledgement (ACK) message back to the transceiver. It the message was not properly received, the host processor 116 sends a negative acknowledgement (NAK) message to the transceiver 110. The transmission link from the host 116 to the transceiver 110 uses the same scheme. When one of the processor 116 or transceiver 110 receives a NAK message, it retransmits the message. When the clock signals used by the host processor and transceiver are not aligned, a message may need to be transmitted several times before an ACK message is received.

Data sent between the transceivers and their respective host processors is encoded into packets according to a known protocol. The protocol includes a data formatting technique (e.g. NRZI encoding), which encodes the transmitting clock signal with the data. The protocol may also include a defined synchronizing signal which is sent to synchronize the receiver to the transmitter before data is sent.

In a typical network of the type shown in FIG. 1, the transceiver 110 sends data to the host, synchronous with its internal clock signal, over a dedicated signal path. The host includes a phase locked loop (PLL) 120 which recovers the clock signal that was used by the transceiver 110 to transmit the data. Using this recovered clock signal, the host processor decodes the data sent by the transceiver. The transceiver 110 decodes data received from the host 116 using a similar PLL 114 which recovers the clock signal that is encoded in the data by the host 116.

This configuration works well when the transmitting clock signals have fixed frequencies and the encoded data streams have frequent transitions. If a data formatting technique is selected which ensures frequent transitions in the data stream, then the loop time constant of the PLL may be selected to be relatively low and still maintain phase lock between the clock signals used by the host processor 116 and the network transceiver 110. Using a data encoding technique such as NRZI ensures that there will be relatively frequent transitions in the signal during most of the time data is transmitted. There will also be intervals, however, in which transitions are infrequent.

A synchronization system used with a data encoding technique in which intervals having infrequent transitions are a possibility may compensate for these intervals by increasing the loop time constant of the PLL's 114 and 120. Due to the relatively long time constant of the PLL's, however, data is usually transmitted across the data link at a single baud rate. This rate is determined when the network is configured based on the length and type of interconnecting cable as well as the capabilities of the transmitters and receivers at either end of the data link. Thus, the assignment of data transmission rates may involve considerable effort during the initial configuration of the network.

Generally, it is desirable to transmit data at the highest rate which is supported by the link. This rate depends on the kind and length of the link and on the environment in which it is used. If, for example, a twisted-pair data link is used in an environment which is intermittently subject to high levels of radio frequency interference (RFI), it may be desirable to reduce the data rate during intervals of high RFI to avoid data corruption. During intervals in which the RFI is absent or attenuated, it may be desirable to increase the data rate to improve system performance.

If the PLL's 114 and 120 of the system shown in FIG. 1 have relatively long loop time constants, they may require a relatively long initial synchronization time and a relatively long synchronization time after each change in frequency of the transmitting clock signal. No data may be transmitted during these synchronization intervals. On the other hand, if the PLL's 114 and 120 have relatively short loop time constants, the frequencies and phases of the transmitting clock signals may be initialized or changed relatively rapidly, but they may exhibit excessive drift when the data signals have long periods without transitions.

U.S. Pat. No. 4,554,659 to Blood et al. addresses this problem by treating the incoming data as an asynchronous signal. Each node includes a first-in-first-out (FIFO) memory which accepts data at one clock signal frequency and provides it at another.

U.S. Pat. No. 4,569,017 to Renner et al describes a synchronization circuit which periodically executes a predetermined set of instructions that cause the internal clocks of two data processing elements to coincide.

SUMMARY OF THE INVENTION

The present invention is embodied in a system which quickly synchronizes a local clock signal to transitions of an externally supplied clock signal having a nominal frequency but, which is not subject to drift during intervals in which no transitions are received. The system includes PLL circuitry, having a coarse locking mode and a fine locking mode. In the coarse locking mode, the PLL circuitry locks the local clock signal in frequency to a local reference oscillator operating at approximately the nominal frequency of the external signal. The lock achieved in this mode has a relatively long time constant. In the fine mode, the PLL locks the local clock signal in phase to the external clock signal. This circuitry has a relatively short time constant, allowing the local clock signal to quickly conform to changes in phase in the external clock signal.

In accordance with one embodiment of the invention, the fine PLL includes a phase detector which automatically compensates for erroneous phase corrections caused by missing transitions in the data signal.

In accordance with another embodiment of the invention, the fine PLL includes a pulse generator which only produces phase error signals when there is a transition in the data signal.

DETAILED DESCRIPTION

Figure 1:
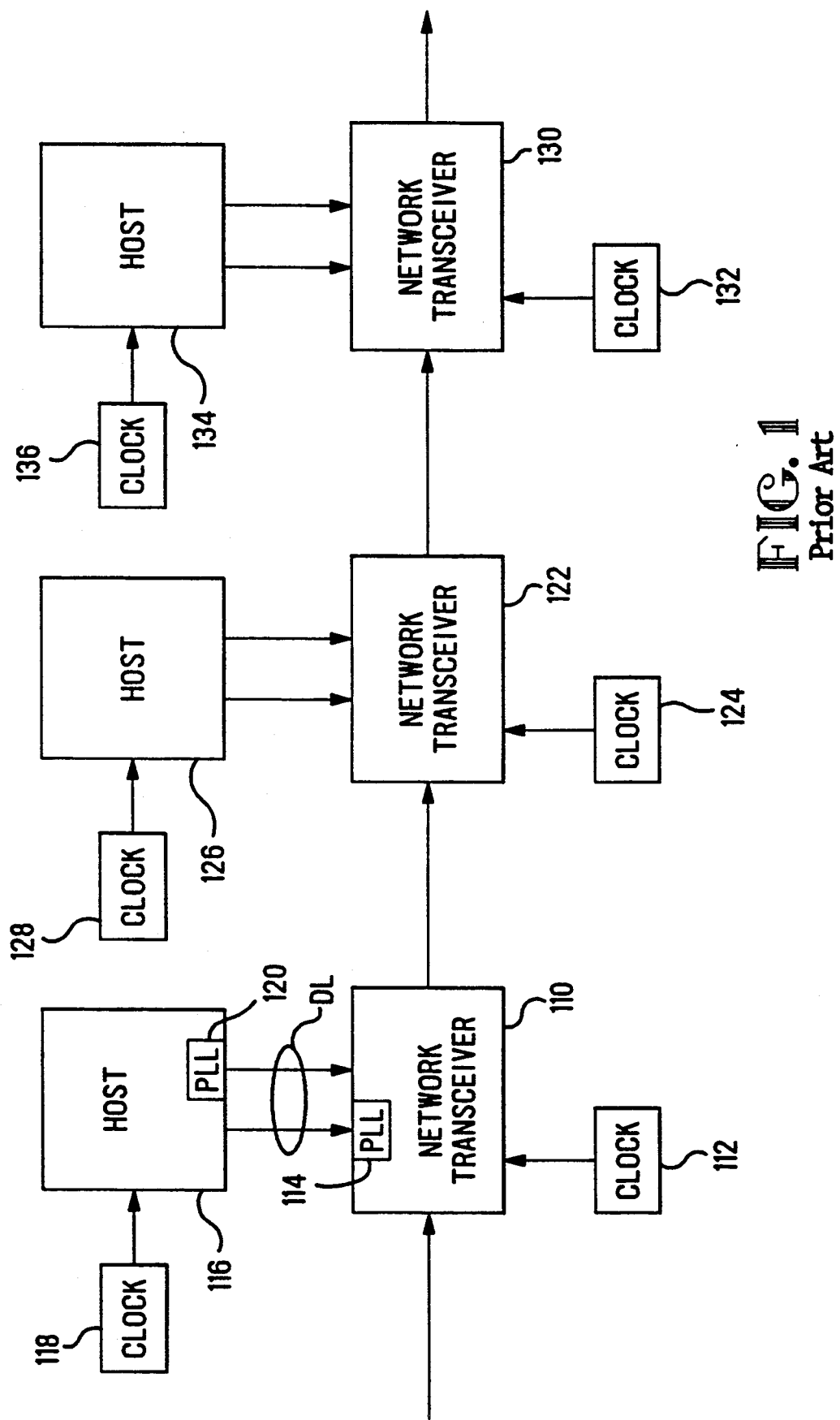
FIG. 1, labeled prior art, is a block diagram of a portion of a data communications network which illustrates a possible environment for the present invention.
Figure 2:
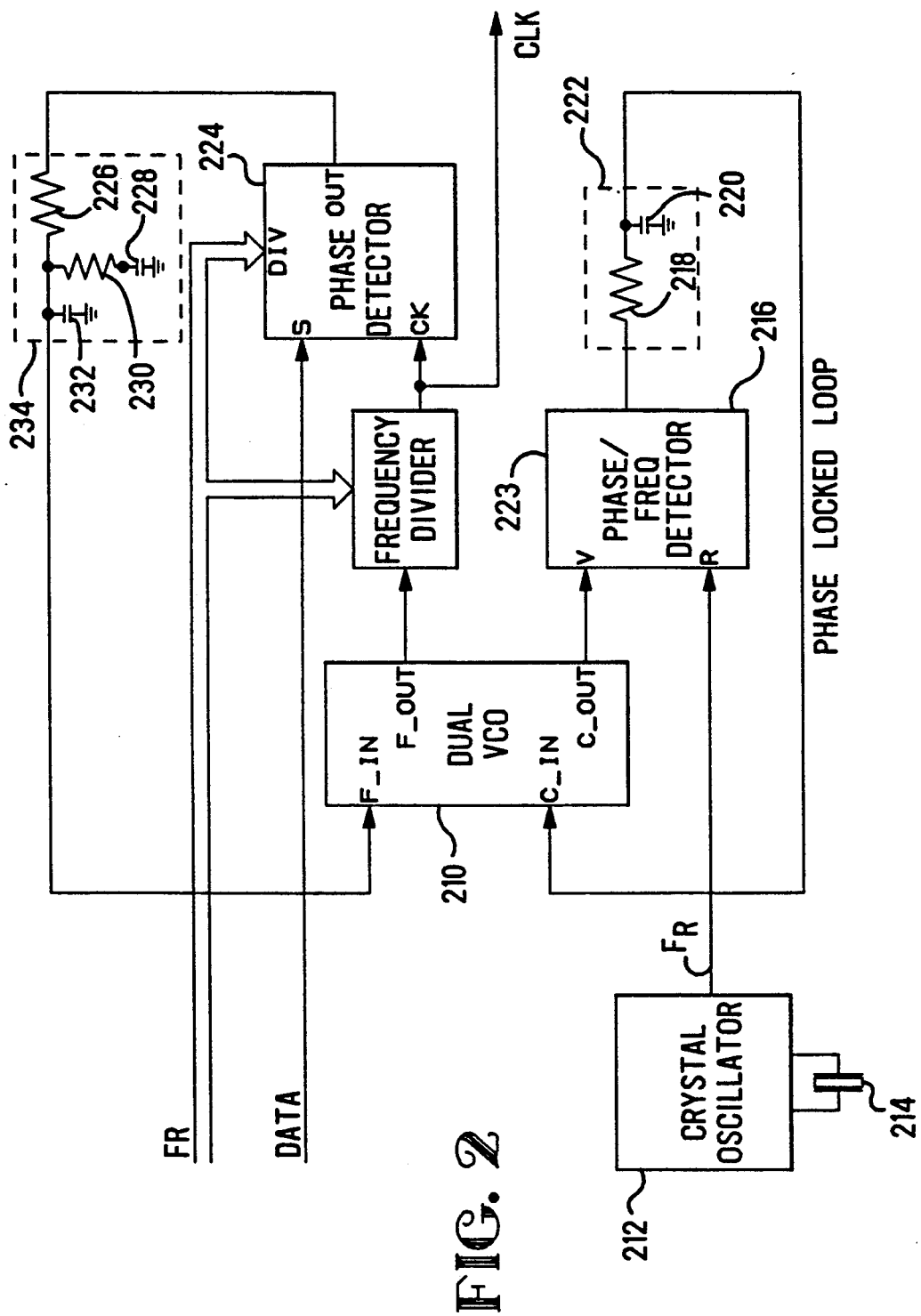
FIG. 2 is a block diagram, partly in schematic diagram form, of exemplary clock synchronization circuitry according to the present invention.

FIG. 2 is a block diagram, partly in schematic diagram form, of exemplary clock generation circuitry which includes separate coarse and fine PLL's. The coarse PLL has a relatively long loop time constant while the fine loop has a relatively short loop time constant. The VCO's of the two PLL's are made from matched components and the control signal for the long time-constant coarse PLL is also applied to the short time-constant fine PLL. In this configuration, when there is no data signal, the fine PLL is locked in frequency to the reference signal produced by the crystal oscillator 212. When a data signal arrives, however, the fine PLL responds quickly, locking the output signal CLK to the data clock signal during the interval in which the synchronizing components of the signal (e.g. a sequence of 4B5B pulses, as defined by the FDDI standard) are received.

The phase comparator 224 used by the fine PLL tends to compensate for missing transitions in the received data signal. Exemplary circuitry which may be used to implement this phase comparator is described below with reference to FIGS. 3a through 3g. Because it ignores missing transitions in the data signal, the fine PLL tends to remain locked in phase to the transitions of the incoming data signal even during intervals in which there are no transitions. Furthermore, the fine PLL includes a frequency divider 223 and circuitry internal to the phase detector which allows the frequency of the clock signal produced by the fine PLL to be quickly changed. Since the fine PLL has a relatively short loop time constant, it can quickly synchronize its clock signal to any data signal that it receives.

This feature may be used to implement an automatic baud rate configuration capability in the network. This capability may be implemented by initially attempting to establish communications across each data link at the highest possible data rate supported by the system and then, successively decreasing the data rate until a rate is reached at which communication can be reliably maintained.

The central component of the clock generator circuit is the dual VCO 210. This circuit, which is described in detail below with reference to FIG. 4, includes two identical VCO's on a single integrated circuit. Since the VCO's are integrated together, their components are closely matched and their performance is substantially identical.

In addition to the VCO 210, the coarse PLL includes a phase/frequency detector 216 and a loop filter 222 which is composed of a resistor 218 and a capacitor 220. The phase detector 216, which is described in detail below with reference to FIGS. 2a and 2b, generates a bipolar pulse signal that indicates the difference in phase between the signal C_OUT provided by the coarse VCO and the reference signal $F_R$ provided by the resonant crystal oscillator 212. This signal has negative-going pulses when the signal $F_R$ leads the signal C_OUT and positive-going pulses when the signal C_OUT leads the signal $F_R$. When the signals C_OUT and $F_R$ are locked in phase, the detector 216 presents a high impedance to the loop filter 222.

The pulses provided by the phase detector 216 are integrated by the loop filter 222 to produce the control signal C_IN for the coarse VCO. As described above, this control signal is applied to the fine VCO to hold it locked in frequency to the reference signal $F_R$ even in the absence of a fine control signal, F_IN.

The signal F_IN is generated by a phase detector 224 and a loop filter 234. Exemplary phase detectors suitable for use as the detector 224 are described below with reference to FIGS. 3a through 3g. These circuits produce a pulse signal that is integrated by a second order loop filter 234. The filter 234 includes two resistors 226 and 230 and two capacitors 228 and 232. The control signal applied to the F_IN input terminal of the fine VCO is the potential across the capacitor 232. The output signal, F_OUT, of the VCO 310 is divided in frequency by circuitry 223 based on a frequency ratio value ($F_R$). This frequency divided signal is provided as the output signal CLK of the PLL circuit, as shown in FIG. 2. The frequency of the clock signal may be changed as a part of the communications protocol, for example, after a predetermined number of NAK messages have been sent or received for a given message.

Figure 2A:
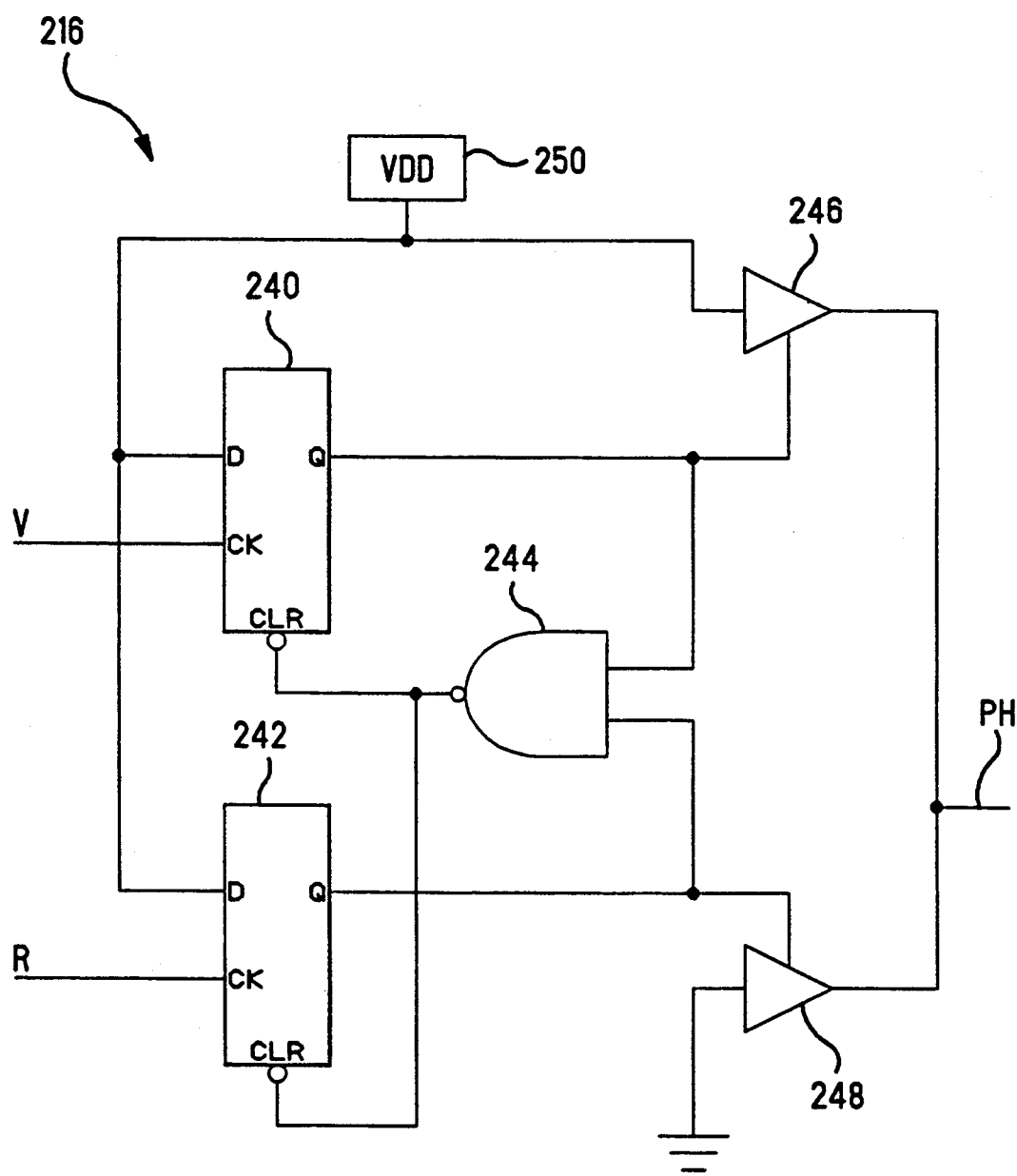
FIG. 2a is a logic circuit diagram of a frequency/phase detector suitable for use in the synchronization circuitry shown in FIG. 2.

FIG. 2a is a logic diagram of an exemplary phase/frequency detector 216. The data (D) input terminals of two flip-flops, 240 and 242 are coupled to a source 250 of operational potential, VDD, which represents a logic-high value. The clock input terminals, CK, of the two flip-flops are coupled to receive the signal C_OUT, the output signal of the coarse PLL provided by the dual VCO 210, via the input terminal V, and the reference frequency signal $F_R$, provided by the crystal oscillator 212, via the input terminal R, respectively. The Q output terminals of the flip-flops 240 and 242 are coupled to respectively different input terminals of a NAND gate 244.

The output terminal of the NAND gate is coupled to the respective clear input terminals, CLR, of the two flip-flops. The Q output terminals of the flip-flops 240 and 242 are also coupled to the enable terminals of respective three-state gates 246 and 248. The data input terminal of the gate 246 is connected to the source 250 and the data input terminal of the gate 248 is connected to ground. The output terminals of the three-state gates 246 and 248 are connected together to provide the output signal, PH, of the phase/frequency detector.

In operation, when the signal C_OUT leads the signal $F_R$, the output signal Q of the flip-flop 240 is logic-high for the amount of time that the C_OUT pulse leads the $F_R$ pulse. As soon as the $F_R$ pulse is registered on the flip-flop 242, the NAND gate 244 resets both of the flip-flops 240 and 242. For the time that the Q output signal of flip-flop 240 is logic-high and the Q output signal of flip-flop 242 is logic-low, the three-state gate 246 is enabled, producing a logic-high pulse on the output line PH. As soon as the two flip-flops are cleared, the output terminal PH presents a high impedance.

The circuit operates in a similar manner when the signal $F_R$ leads the signal C_OUT. In this instance, however, the three-state gate 248 is enabled for the lead time, producing a logic-low pulse for the signal PH.

Figure 2B:
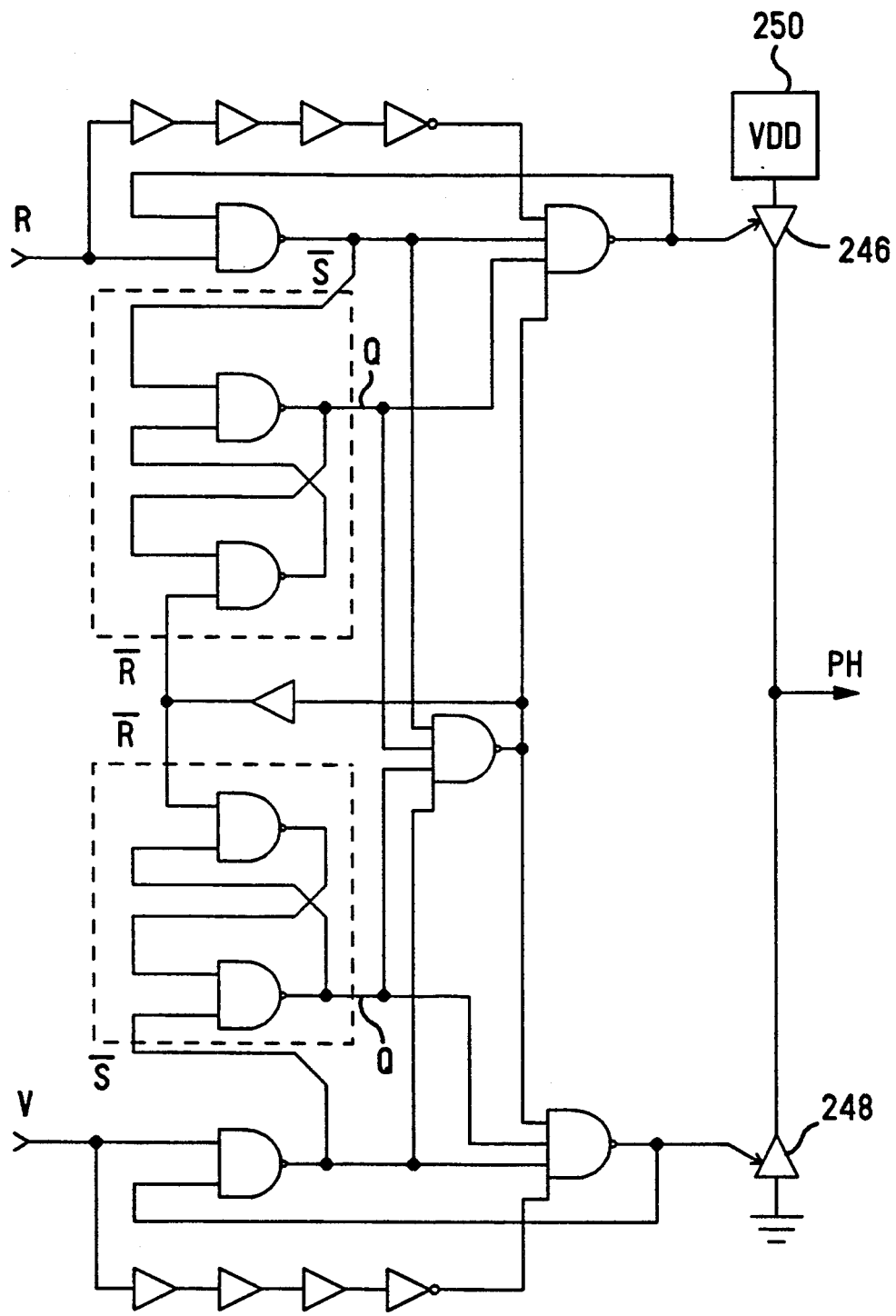
FIG. 2b, labeled prior art, is a logic diagram of an alternative frequency/phase detector suitable for use in the synchronization circuitry shown in FIG. 2.

An alternative phase/frequency detector is shown in FIG. 2b. This detector includes a somewhat different logic circuit which generates the enabling pulses for the two three-state gates 246 and 248. This detector operates on the same principles as the 16G044 phase/frequency comparator available from GigaBit logic, Newbury Park, Calif. The operation of this phase comparator is described in the specification sheet for the 16G044 integrated circuit which is hereby incorporated by reference for its teachings on phase comparators.

Figure 3A:
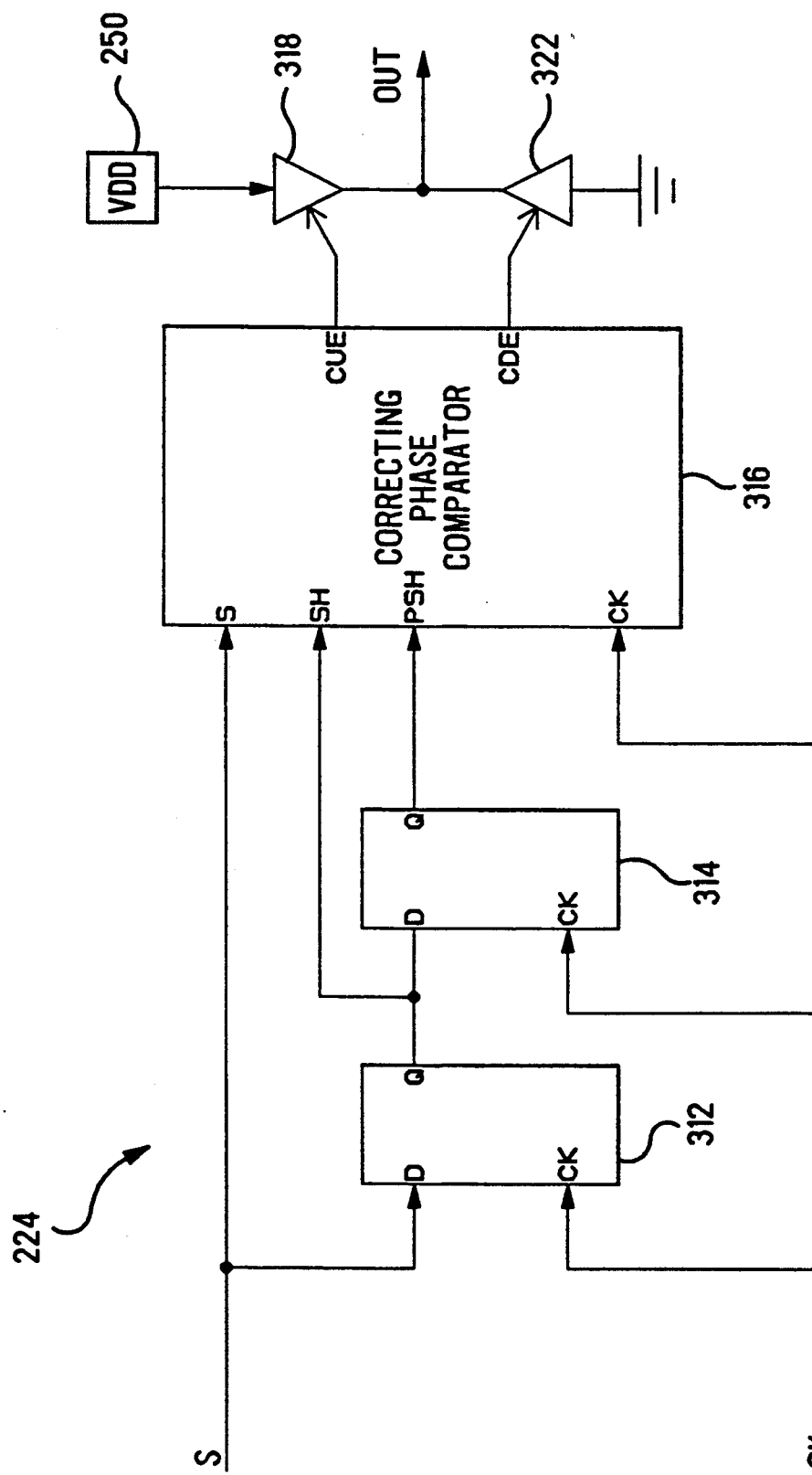
FIGS. 3a and 3b are logic diagrams, partly in schematic diagram form of an exemplary phase detector suitable for use in the synchronization circuitry shown in FIG. 2.

FIG. 3a is a logic block diagram of an exemplary phase detector circuit which may be used as the phase detector 224 in the synchronizing circuit shown in FIG. 2. This phase detector does not use the optional input port DIV shown in FIG. 2. The phase detector shown in FIG. 3a automatically compensates for missing transitions in the input data stream to keep the phase of the signal F_OUT from drifting out of lock.

The problem which arises when missing edges are encountered is best illustrated with reference to the phase/frequency detector shown in FIG. 2a. As described above, when a transition of the signal applied to the input terminal R precedes the corresponding transition of the signal applied to the input terminal V, the three-state gate 248 is enabled to provide a negative pulse spanning the interval between the two transitions.

If, however, the signal applied to the terminal V is an encoded data signal having missing transitions while the signal applied to the terminal R is a clock signal, phase errors may be detected where none exist. These erroneous phase errors would occur when the data signal holds at one state while the clock signal experiences a transition from the one state to the other state. In this instance, the phase detector shown in FIG. 2a would produce an erroneous negative pulse spanning the missing transition period.

It is difficult to avoid these erroneous pulses because a missing transition in the data signal can only be identified as erroneous after it has occurred. The phase detector shown in FIG. 3a recognizes when an erroneous pulse has been emitted due to a missing transition, and emits a pulse of opposite polarity to compensate in the loop filter for the erroneous pulse.

In order to generate these correcting pulses, the phase detector monitors the current state of the data signal as well as the state of the data signal during the two prior periods of the clock signal. As shown in FIG. 3a, the input data signal S is applied to the S input terminal of a correcting phase comparator 316 and to the D input terminal of conventional negative-edge triggered data-type flip-flop 312. The clock input terminal of the flip-flop 312 is coupled to receive the signal CK provided by the frequency divider 223. This signal is the clock signal which is to be synchronized to the input data signal.

The output signal provided by the flip-flop 312 is coupled to an input terminal SH of the correcting phase comparator 316. This signal represents the state of the input data signal during the previous period of the clock signal. The output signal of the flip-flop 312 is also applied to the D input terminal of a flip-flop 314, the clock input terminal of which is also coupled to receive the signal CK. The output signal of the flip-flop 314 is coupled to the input terminal PSH of the correcting phase comparator 316. This signal represents the state of the input data signal at a time two clock periods prior to the present. The clock signal is applied to the terminal CK of the correcting phase comparator 316.

The values of the signals S, SH and PSH may be used to determine if there was a transition of the signal S in the present period of the signal CK or in the immediately prior period of the signal CK. If S is the same as SH then the most recent transition of the signal CK has preceded any transition of the signal S. If SH is the same as PSH then there was no transition of the signal S in the previous period of the signal CK. The correcting phase comparator 316 uses these signals to generate an output signal representing the instantaneous phase difference between the signals S and CK which is corrected for errors caused by missing transitions in the signal S.

The correcting phase comparator 316 has two output terminals, CUE (charge-up enable) and CDE (charge-down enable). The signal CUE is coupled to the control input terminal of a three-state gate 318 which is configured to selectively pass a logic-high value (i.e. VDD) as provided by the source of operating potential 250. The signal CDE is coupled to the control input terminal of a three-state gate 322 which is configured to selectively pass a logic-low value (i.e. ground or VSS). When CUE and CDE are both logic-low, a high impedance is presented at the output terminal OUT of the phase detector shown in FIG. 3a.

Figure 3B:
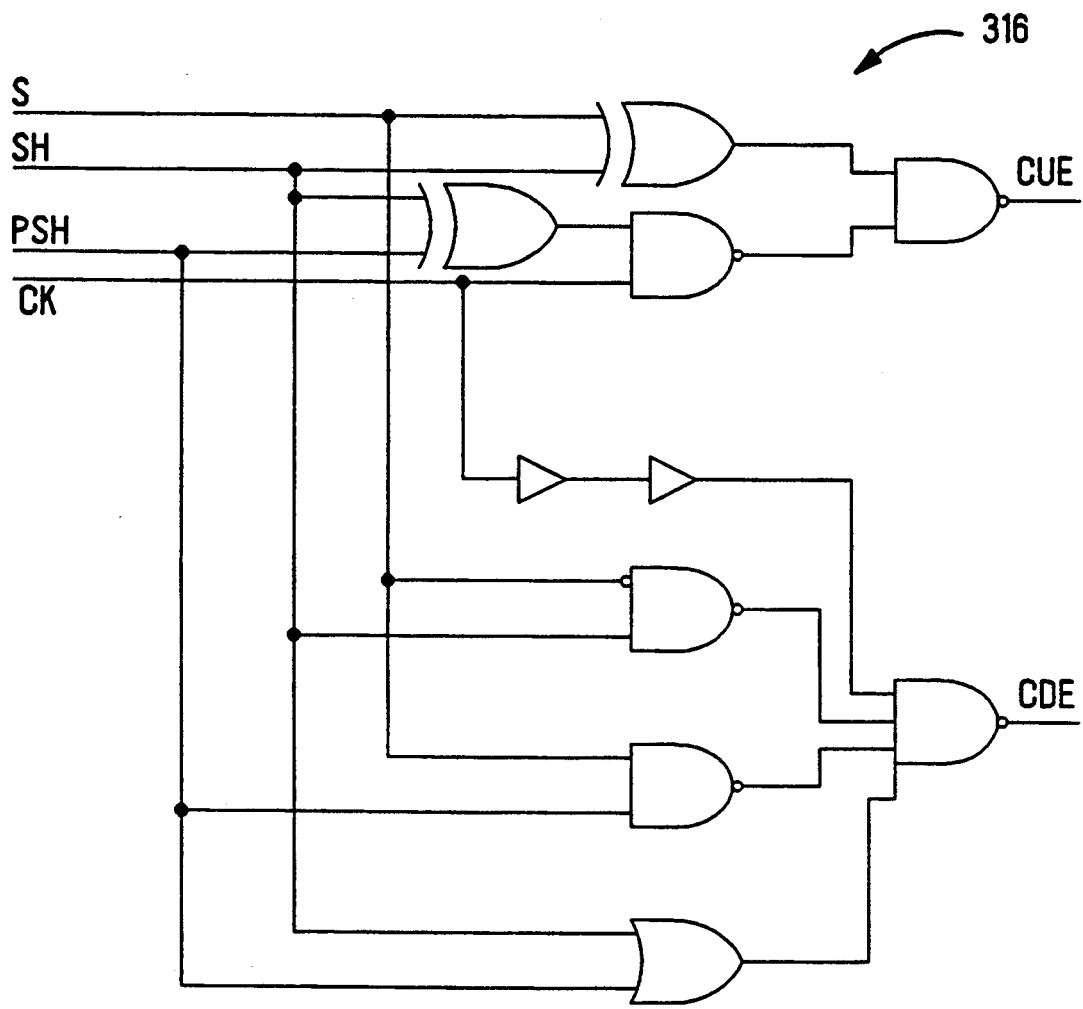

FIGS. 3b is a logic diagram of an exemplary circuits which may be used as the correcting phase comparator 316. This comparator implements a logic function which may be represented by the following fragment of program code in the programming language Pascal.

```
if SH then
   begin
      if PSH then
         begin                          (*The makeup case*)
            CDE: = CK and S and not (CK or (not S));
            CUE: = (CK or (not S)) and not (CK and S);
         end
      else
         begin
            CDE: = CK and S and not ((not CK) and (not S));
            CUE: = ((not CK) and (not S)) and not (CK and S);
         end;
   end
else
   begin
      if not PSH then
         begin                          (*The makeup case*)
            CDE: = CK and (not S) and not (CK or S);
            CUE: = (CK or S) and not (CK and (not S));
         end
      else
         begin
            CDE: = CK and (not S) and not ((not CK) and S);
            CUE: = (not CK) and S and not (CK and not S));
         end;
end;
```

Figure 3C:
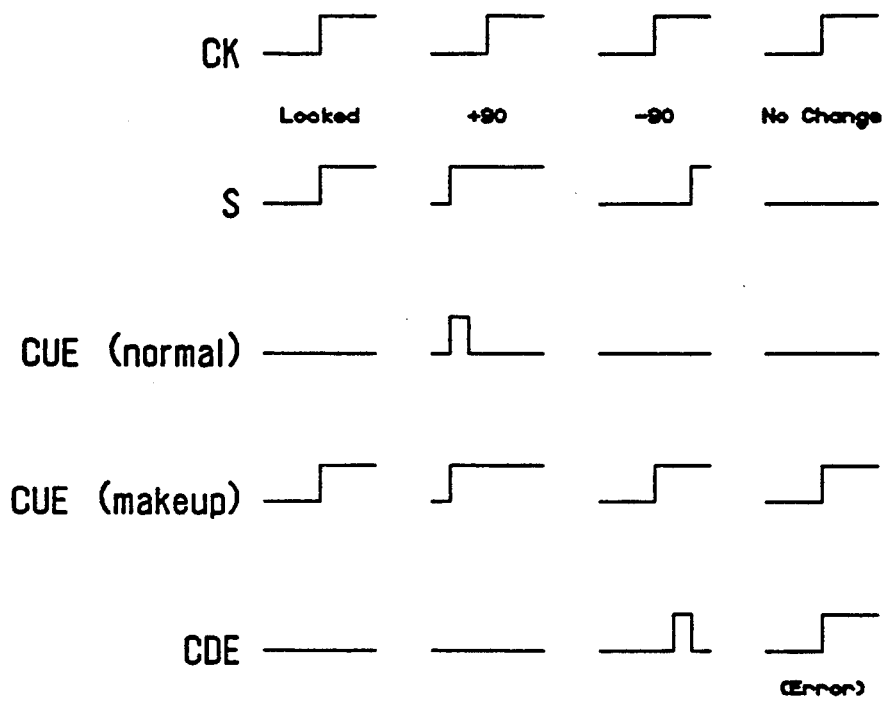
FIGS. 3c and 3d are timing diagrams which are useful for describing the operation of the circuitry shown in FIGS. 3a and 3b.
Figure 3D:
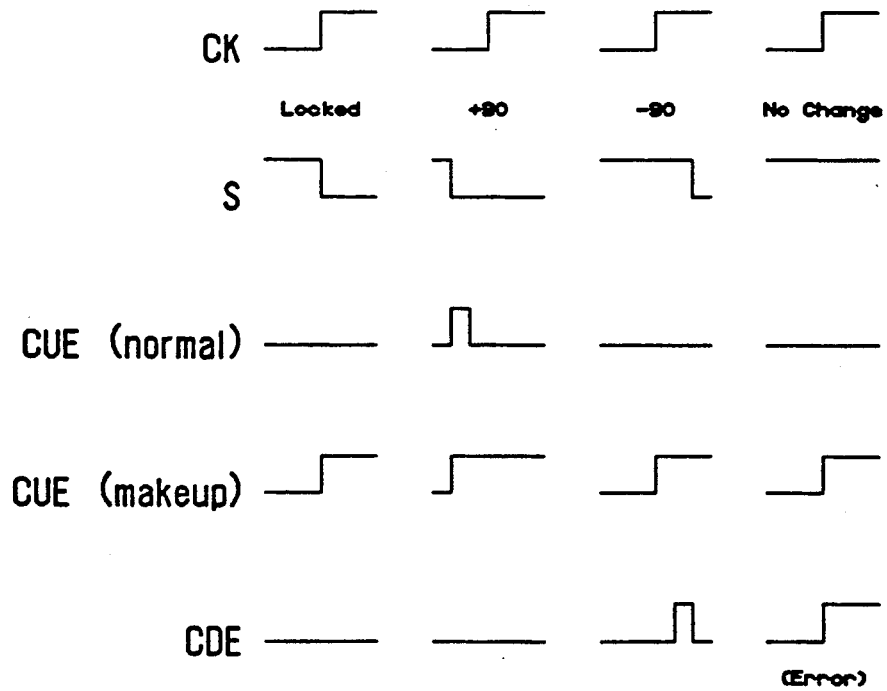

FIG. 3d is a timing diagram which is useful for describing the operation of the phase comparator if the signal S is logic-low on a negative-going transition of the signal CK. Four cases are represented by the four columns of the figure: the locked condition, the signal CK leading the signal S by 90°, the signal CK trailing the signal S by 90° and no change in the signal S during a period of the signal CK. The rows of the figure represent the different signals shown in FIG. 3b.

In FIG. 3c, there are two different CUE waveforms. The CUE waveform labeled "normal" occurs if the signal S had a transition during the previous period of the signal CK. The CUE waveform labeled "makeup" occurs if the signal S did not have a transition during the previous period of the signal CK. This waveform corrects for an erroneous pulse of the signal CDE that the phase comparator emitted in the previous clock period because there was no transition in the signal S. the signal CK by 90°, the CDE output signal is inactive while the CUE output signal is a rectangular pulse having a width that is proportional to the phase difference between the signals S and CK. Conversely, when the signal CK leads the signal S by 90°, the signal CUE is inactive while the CDE output signal is a rectangular pulse having a width proportional to the phase difference between the signals S and CK.

If, however, the signal S is logic-low, and does not have a transition in a given period of the signal CK, the circuit shown in FIG. 3b produces a pulse of the signal CDE having a pulse width of one-half of one period of the signal CK. This is an erroneous pulse, one which tends to decrease the frequency of the signal produced by the VCO by draining charge from the capacitors 228 and 232 of the loop filter 234.

To compensate for this erroneous pulse, the circuitry shown in FIGS. 3a and 3b retains the state of the signal S during the previous two periods of the signal CK and emits a correcting pulse on the signal CUE if the retained states indicate that an erroneous pulse had previously been emitted. If the signal S leads the signal CK by 90°, the pulse of the signal CUE in the makeup mode includes a pulse having a width proportional to the phase difference between the signals S and CUE and a pulse having a width of one-half of one period of the signal CK. If the transitions of the signals S and CK are aligned or if the transition of S lags the transition of CK, the makeup pulse of the signal CUE has a pulse width of one-half of one period of the signal CK.

A similar set of rules applies if the signal S is logic-high on the negative going transition of the signal CK. The signals which define the operation of the circuitry shown in FIGS. 3a and 3b in this instance are shown in FIG. 3d. If the correcting phase comparator 316 makes an error when there is no signal transition, the nature of the error is the same as when the signal S is logic-low: an erroneous CDE pulse is emitted. The correcting phase comparator 316 takes the same corrective action in this instance, emitting a pulse of the signal CUE which is one-half of one period of the signal CK when the previous state of the signal S indicates that an erroneous CDE pulse had been emitted.

This description of the operation of the circuitry shown in FIGS. 3a and 3b has been simplified for the sake of clarity. In the circuitry shown in FIG. 3b, implementing the above program fragment, steps are taken to ensure that the signals CDE and CUE are never asserted simultaneously. If these signals were asserted at the same time, a short-circuit path from VDD to ground would be created. The current flowing through this path could cause current surges that may adversely affect the components of the phase detector.

Figure 3E:
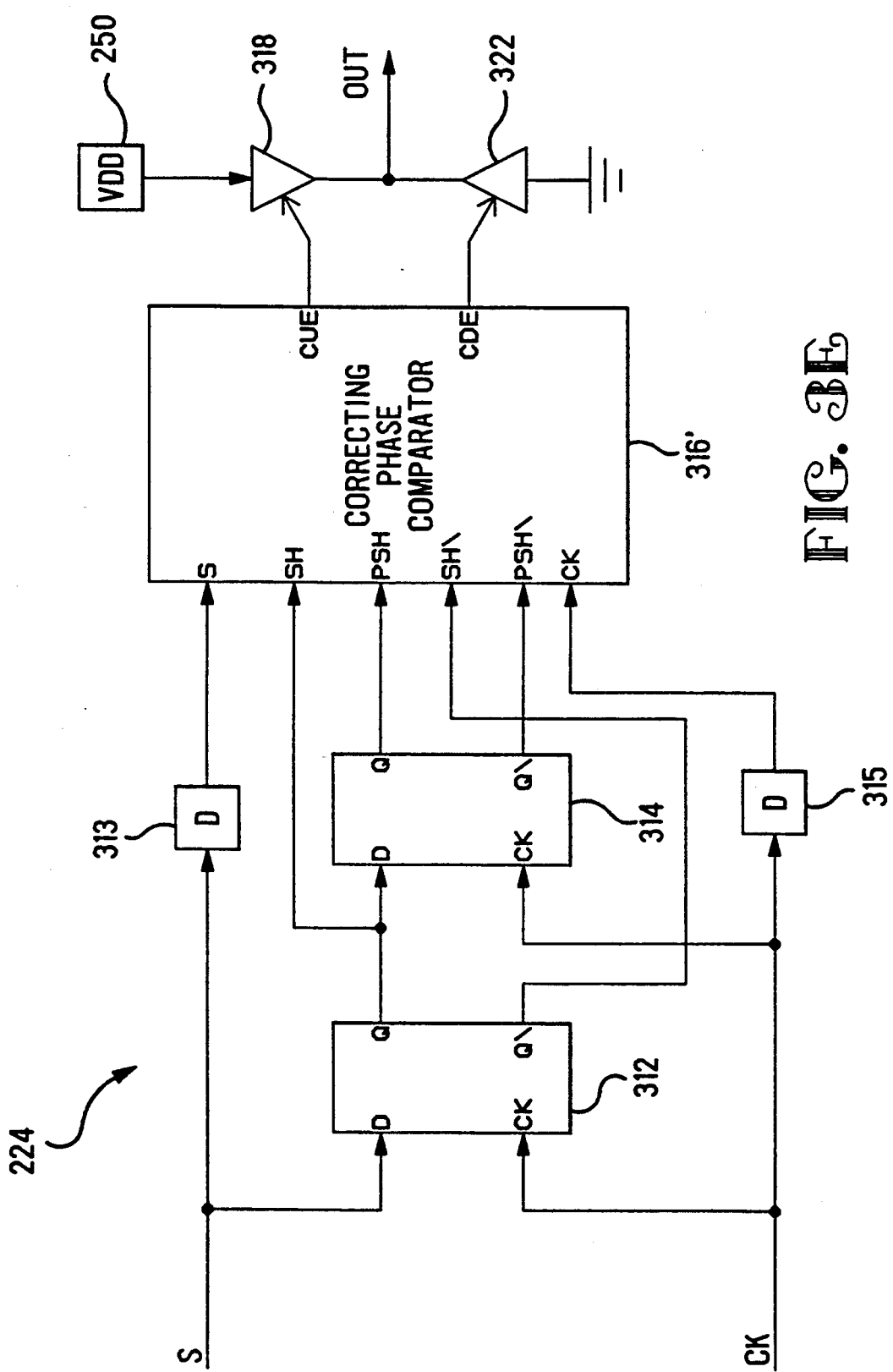
FIGS. 3e and 3f are logic diagrams, partly in schematic diagram form, of an alternate exemplary phase detector suitable for use in the synchronization circuitry shown in FIG. 2.
Figure 3F:
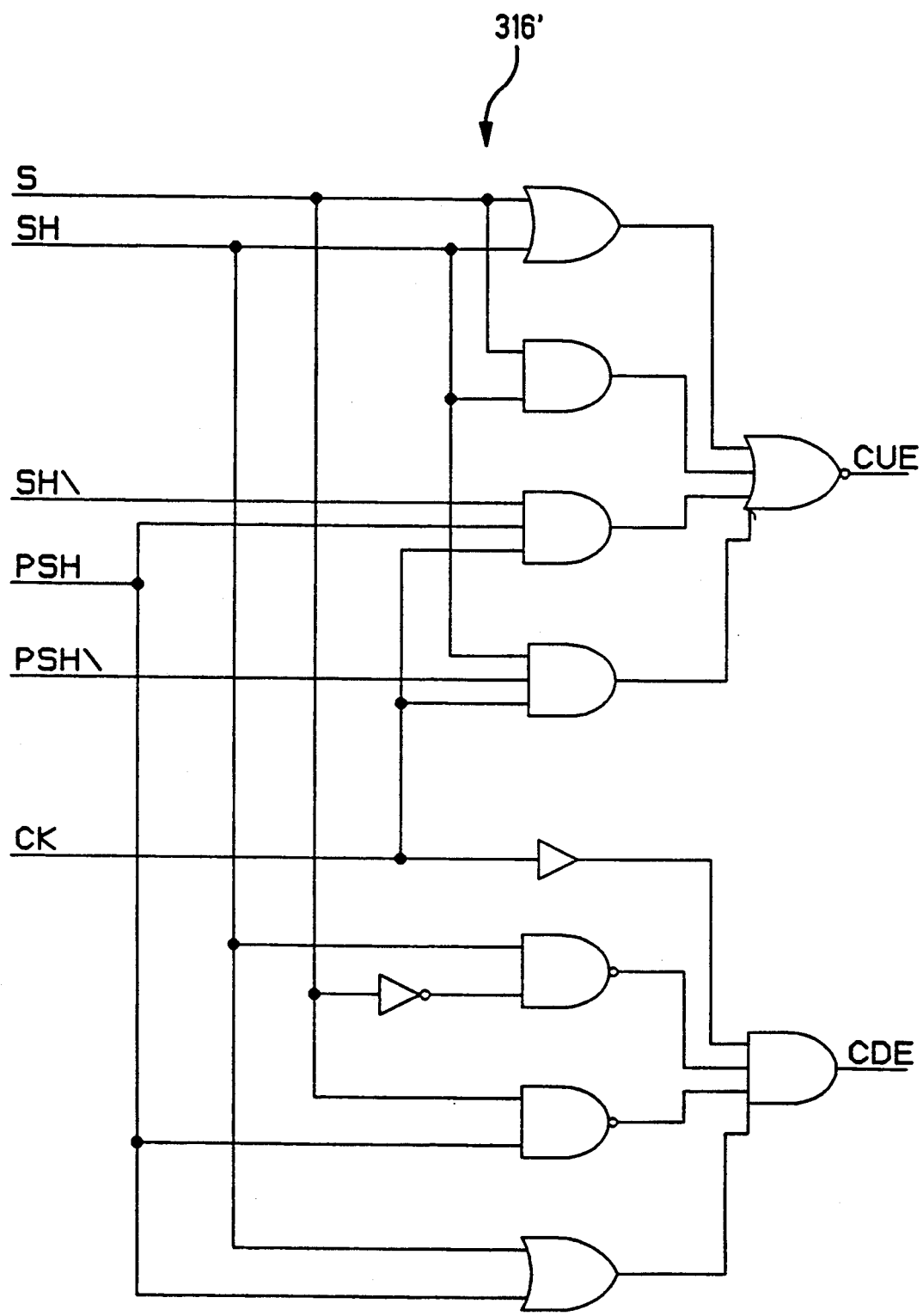

FIGS. 3e and 3f are logic diagrams of alternate circuits for the phase detector and correcting phase comparator described above in reference to FIGS. 3a and 3b, respectively. The circuit shown in FIG. 3e operates in the same manner as that shown in FIG. 3a. The only differences are the addition of two delay elements, 313 and 315, which compensate for the signal propagation delay through one of the flip-flops 312 and 314, and the use of the complementary outputs (Q ) of the flip-flops 312 and 314.

These output signals are applied to two new input terminals of a new correcting phase comparator 316'. This phase comparator, which is shown in FIG. 3f, implements the same logic function as the comparator shown in FIG. 3b. The circuits shown in FIGS. 3e and 3f represent an optimally balanced implementation of the entire phase detector 224, shown in FIG. 2.

Figure 3G:
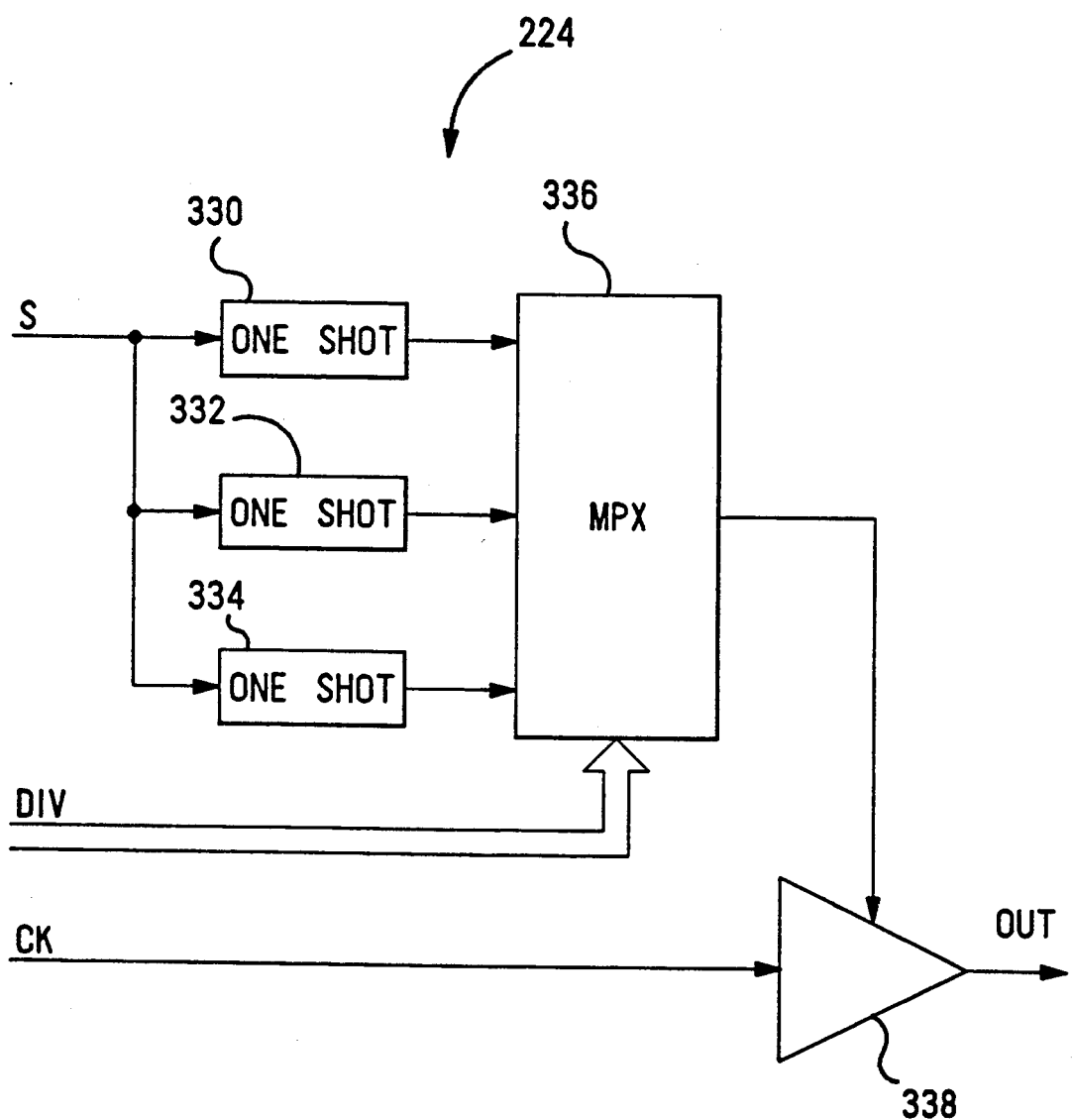
FIG. 3g is a logic diagram of an alternative phase detector suitable for use in the synchronization circuitry shown in FIG. 2.

FIG. 3g is a logic diagram of a phase detector which may also be used as the phase detector 224. This phase detector uses the optional DIV input shown in FIG. 2. The phase detector shown in FIG. 3g includes an edge detector, having a plurality of precision one-shot devices 330, 332 and 334 and a multiplexer 336. While three one-shot devices are shown in FIG. 3g, it is contemplated that a larger number may be used. The one-shot devices 330, 332 and 334 produce rectangular pulses of varying pulse width in response to a transition of the signal S. For any given frequency of the signal CK, the one-shot device which is selected is the one that produces the widest pulse that is less than the period of the signal CK. The multiplexer 336 selects one of the pulses based on the frequency of the signal CK, as determined from the multi-bit signal DIV. In general, the width of the pulse provided by the multiplexer 336 is inversely proportional to the frequency of the signal CK.

The pulse provided by the multiplexer 336 is applied to the control input terminal of a three state gate 338. When this pulse is asserted, the signal CK is passed to the loop filter 234. If the signal CK is logic-high when the enabling signal is asserted, then current is applied to the loop filter 234, increasing the potential across the capacitors 228 and 232. This tends to increase the frequency of the signal CK provided at the terminal F_OUT of the dual VCO 210.

Alternatively, if the signal CK is logic-low during when the control pulse is asserted, the capacitors 228 and 232 tends to discharge through the resistors 226 and 230. This tends to decrease the frequency of the signal CK. The net charge on the capacitors 228 and 232 remains substantially the same when there is a transition of the signal S which evenly bisects the interval defined by the control pulse, since the amounts of charge provided to and drained from the capacitors 228 and 232 are substantially equal.

Since the three-state gate is only enabled on the occurrence of transition in the signal S, this phase detector is relatively insensitive to intervals of missing transitions in the data signal. During these intervals, the phase detector 224 presents a high impedance to the loop filter 234.

Figure 4:
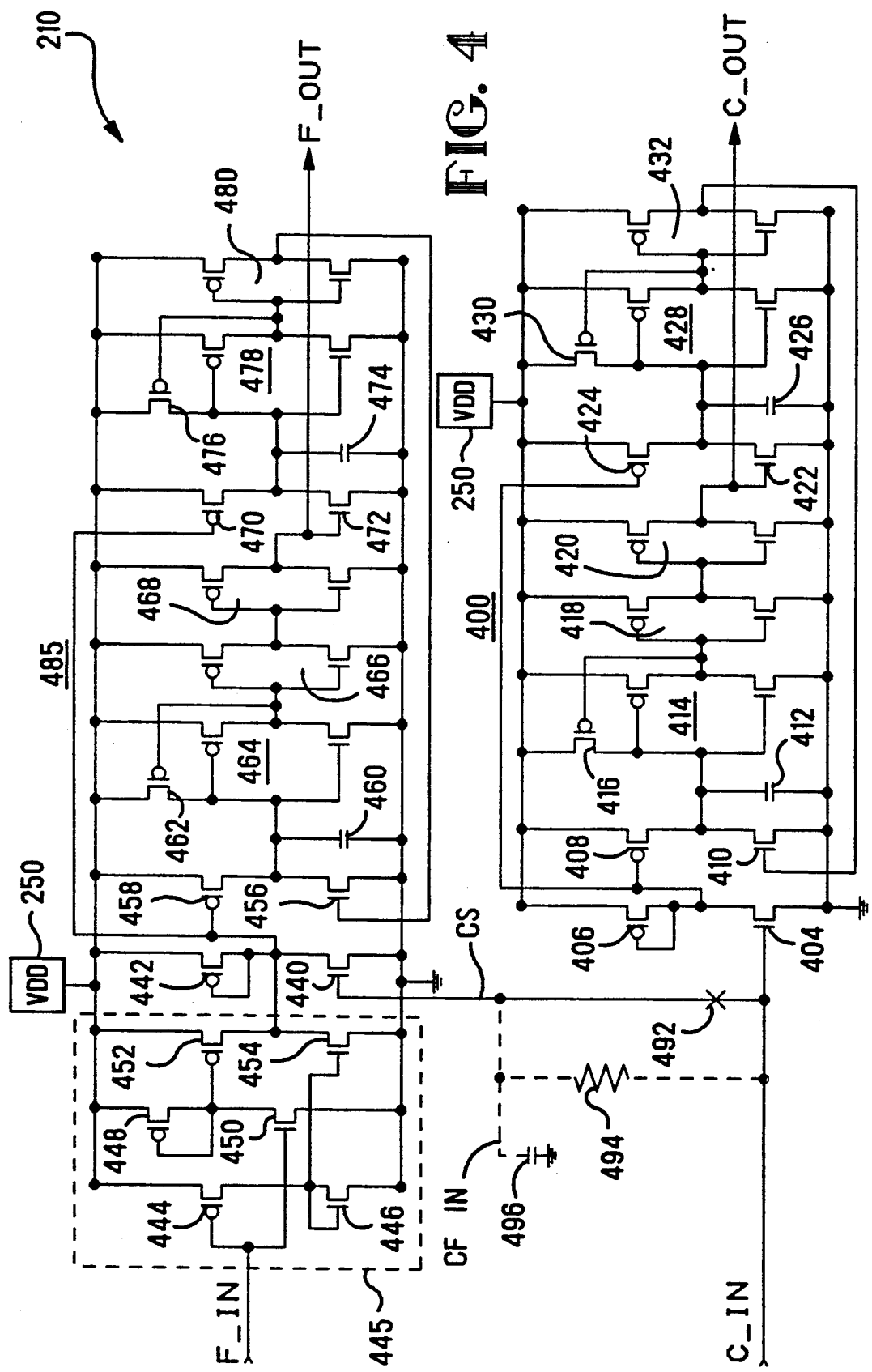
FIG. 4 is a schematic diagram, partly in block diagram form, of a dual voltage controlled oscillator suitable for use in the circuitry shown in FIG. 2.

FIG. 4 is a schematic diagram of a dual VCO suitable for use in the clock signal generation circuitry shown in FIG. 2. The coarse VCO 400 and the fine VCO 485 are identical except that the fine VCO 485 includes an additional circuit 445 which couples the fine input signal, F_IN, with the coarse control signal, C_IN, to control the frequency and phase of the signal F_OUT provided by the fine VCO 485. Since the coarse VCO 400 and fine VCO 485 are substantially identical, only the coarse VCO 400 is described below.

The VCO 400 includes five complementary metal oxide semiconductor (CMOS) inverter circuits, 414, 418, 420, 428 and 432 arranged in a ring. That is to say, coupled so that the output signal provided by the last inverter 432 is provided as an input signal to the first inverter 414. It is well known that a circuit in this configuration acts as an oscillator. The frequency of the signal C_OUT, produced by the oscillator, is determined by transistors 408 and 424, configured as controlled current sources, which charge capacitors 412 and 426. Current source 408 and capacitor 412 determine the duration of the positive half-cycle of the signal C_OUT while current source 424 and capacitor 426 determine the timing of the negative half-cycle. The amount of current provided by the sources 408 and 424 is determined by the input signal C_IN, as described below.

The rate at which current is provided to the capacitors 412 and 426 determines the amount of time needed to charge the capacitors to the threshold potential necessary to switch the respective inverters 414 and 428. This, in turn, determines the frequency of the signal C_OUT provided by the VCO 400. Capacitor 412 is discharged, through transistor 410, when a logic-high output signal appears at the output terminal of the inverter 432. In the same way, capacitor 426 is discharged when transistor 422 is rendered conductive by a logic-high state on the output terminal of the inverter 420.

The inverters 414 and 428 each include a transistor, 416 and 430, respectively, which shunts current past the respective controlled current sources 408 and 424 to the capacitors 412 and 426 once the threshold potential has been reached. This shunted current quickly increases the charge on the capacitors, and thus, the potential presented to the respective input terminals of inverters 414 and 428. These shunting transistors prevent metastability in the transitions of the clock signal and reduce the sensitivity of the VCO to noise.

The level of current provided by the current sources 408 and 424 is determined by the level of the signal C_IN applied to a network which includes transistors 404 and 406. The level of current drawn through the transistor 406 is dependent on the level of voltage applied to the gate of the transistor 404. In this configuration, the transistor 404 acts as a voltage controlled current sink. The transistors 406, 408 and 424 are configured as a current mirror having one input leg and two output legs. Thus, the level of current drawn through transistor 406 by transistor 404 is reflected, through this current mirror as an identical current flow through each of the current source transistors 408 and 424. In this configuration, the level of voltage applied to transistor 404 in response to the signal C_IN determines the amount of current supplied by the transistors 408 and 424 which, in turn, determines the rate at which the capacitors 412 and 426 charge and so, the oscillatory frequency of the VCO 400.

The VCO 485 is identical to the VCO 400 except for the fine control input network 445. Since they are fabricated together on a common substrate, each of the corresponding components of the two VCO's are very closely matched. The transistors 404 and 440 are matched voltage controlled current sinks and their control inputs are coupled together. Thus, in the absence of a control signal from the network 445, the VCO 485 oscillates at the same frequency as the VCO 400.

As described above in reference to FIG. 3, the control signal F_IN, for the fine VCO 485, is the potential developed across the filter capacitor 232. This potential is applied to the control circuit 445 which is configured as a push-pull current source that augments the current flow generated by the transistor 440 in response to the coarse input signal C_IN.

In the circuit 445, transistors 446 and 454 form a first current mirror and transistors 448 and 452 form a second current mirror. The input stage of the first current mirror is coupled to the source electrode of the transistor 444. The current drawn through the transistor 444 changes with the level of the signal FIN, applied to the gate electrode of transistor 444. This current is reflected, through the first current mirror to the junction of the transistors 452 and 454. In the same manner, the potential applied to the gate electrode of transistor 450 determines the current flow through the input leg of the second current mirror. This current flow is reflected through the second current mirror to the junction of the transistors 452 and 454. To the extent that the current flow through transistor 452 is not matched by the current flow through transistor 454, the excess current is provided to or drawn from the junction of the transistors 440 and 442. This differential current is summed with the coarse control current drawn by the transistor 440 and the result is reflected through the two output legs of the current mirror formed by the transistors 442, 458 and 470. These output legs provide the currents which charge the capacitors 460 and 474.

An alternative embodiment of the input circuitry for the dual VCO 210 is shown in phantom in FIG. 4. In this embodiment, the connection, CS, between the gates of the transistors 404 and 440 is broken as indicated by the X 492. In its place, the coarse input signal C—IN is passed through a low pass filter, formed by a resistor 494 and a capacitor 496, to produce the signal CS which is applied to the gate electrode of the transistor 440. This input circuitry is used when the control signal for the coarse VCO 400 produces excessive jitter in the signal produced by the fine VCO 485. This jitter is caused by relatively high frequency artifacts in the coarse control signal C—IN, which are collectively known as ripple.

This alternate embodiment is implemented by breaking the line CS as shown and routing the line connected to the gate input terminal of the transistor 440 out of the dual VCO 210 as a coarse-fine input terminal CF—IN. The capacitor 496 and resistor 494 are components which may be separate from the dual PLL 210. The values of the resistor 494 and capacitor 496 depend on the level and frequency of the ripple in the signal C—IN. The filter implemented by these components should shunt most of the ripple components of the signal to ground, applying only the slowly varying frequency control signal to the VCO 485.

As described above, the frequency and phase of the fine VCO 485 are controlled as offsets from the frequency and phase of the reference frequency signal, $F_R$, provided by the resonant crystal oscillator 218.

Exemplary clock signal generation circuitry has been described in which a long-time constant PLL is used to hold the signal produced by the circuit close in frequency to an intermittently received signal. When the received signal is present, a short-time constant PLL takes over, to quickly lock the clock signal to the received signal.

While the invention has been described in terms of exemplary circuitry, it is contemplated that it may be practiced as outlined above with modifications within the spirit and scope of the appended claims.

The invention claimed is:

1. Apparatus for generating a clock signal which is locked in phase to a received signal having intermittent transitions which are synchronous with a transmitting clock signal having a nominal frequency, said apparatus comprising:
    a source of reference signal having a predetermined frequency which is approximately equal to the nominal frequency;
    first variable frequency oscillator means responsive to a coarse control signal for producing an oscillatory output signal;
    coarse control means coupled to said first variable frequency oscillator means and responsive to said reference signal and to said oscillatory output signal, for generating said coarse control signal to lock the frequency of said oscillatory output signal to the reference signal;
    second variable frequency oscillator means, responsive to a frequency control signal for producing said clock signal; and
    fine control means, coupled to said coarse control means and to said second variable frequency oscillator means and responsive to said received signal, for augmenting said coarse control signal to generate said frequency control signal to lock the frequency and phase of said clock signal to said received signal.

2. The apparatus of claim 1 wherein:
    the combination of said first variable frequency oscillator means and said coarse control means is a phase locked loop (PLL) having a predetermined loop time constant; and
    the combination of said second variable frequency oscillator means and said fine control means is a further PLL having a loop time constant significantly less than said predetermined time constant.

3. The apparatus of claim 1 wherein said fine control means includes:
    phase detecting means for emitting pulses having a first polarity and a second polarity, opposite to the first polarity, when said clock signal leads and lags the transitions of said received signal, respectively;
    correcting means for recognizing when a transition in the received signal has not occurred and for emitting a pulse of said second polarity to correct for one of said pulses of said first polarity which was emitted by said phase detecting means in response to the recognized missing transition in said received signal; and
    means for combining the pulses emitted by said phase detecting means and said correcting means to augment said coarse control signal to generate the frequency control signal for said second variable frequency oscillator means.

4. The apparatus of claim 1 wherein said fine control means includes:
    pulse generating means, responsive to said received signal for generating pulses coincident with the transitions of said received signal;
    gating means, coupled to said second variable frequency oscillator means and responsive to said generating pulses for providing said clock signal as an output signal while said pulse is active and for providing a high impedance as said output signal otherwise; and
    means, including a capacitor for accumulating the output signal of said gating means to generate a signal value which is used to augment said coarse control signal to generate the frequency control signal for said second variable frequency oscillator means.

5. The apparatus of claim 1 wherein the source of reference signal is transmitting clock signal generator which provides a transmitting clock signal for encoding data to be sent to a remote data processing device.

6. The apparatus of claim 1 wherein:
    said first variable frequency oscillator means includes a first voltage controlled oscillator and said second variable frequency oscillator means includes a second voltage controlled oscillator;
    said coarse control means includes:
        frequency detector means, coupled to said first voltage controller oscillator for generating a frequency difference signal indicating a difference in frequency between the oscillatory signal of said first variable frequency oscillator means and said reference signal; and
        loop filter means, coupled to said frequency detector means for integrating the frequency difference signal to generate said coarse control signal; and
    said fine control means includes:
        phase detector means for generating a phase difference signal indicating a difference in phase between said received signal and said clock signal;

second loop filter means, coupled to said phase detector means for integrating said phase difference signal to generate a phase control signal; and means for combining said phase control signal with said coarse control signal to generate said frequency control signal.

7. The apparatus of claim 6 wherein said first and second voltage controlled oscillators are constructed from matched components and, in the absence of said received signal, said coarse control signal conditions said first and second voltage controlled oscillators to oscillate at substantially the same frequency.

8. The apparatus of claim 7 wherein said first and second voltage controlled oscillators are included on a single integrated circuit.

9. Apparatus for generating a clock signal which is locked in phase to a received data signal having intermittent transitions, comprising:

variable frequency oscillator means, responsive to a control signal, for producing said clock signal;

phase detector means including:
  means responsive to said clock signal and to said received data signal for generating pulses of a first polarity and pulses of a second polarity, opposite to the first polarity, when transitions of said clock signal respectively lead and lag transitions of said received data signal in phase;
  means for recognizing when a transition in said received data signal did not occur during a previous period of said clock signal and when a pulse of said first polarity was erroneously emitted; and
  means, coupled to the means for recognizing, for generating a compensating pulse of said second polarity to compensate for the pulse of said first polarity which was erroneously emitted during said previous period of said clock signal; and filter means for combining the pulses of the first and second polarity and the compensating pulses generated by said phase detector means to generate said control signal for said variable frequency oscillator means.

10. In a data communications system including first and second data processing systems each including a respective internal clock signal generator which provides a respective internal clock signal, and means, coupled to said clock signal generator for encoding data for transmission to the other one of said first and second data processing systems as a data signal, each of said first and second data processing systems further including apparatus for receiving the data signal transmitted by the other one of said first and second data processing systems said apparatus comprising:

first phase locked loop means responsive to said internal clock signal including means for generating a first control signal and first variable frequency oscillator means, responsive to the first control signal for generating a first output oscillatory signal which is locked in frequency to said internal clock signal; and second phase locked loop means including:
  second variable frequency oscillator means responsive to a second control signal for generating a second output oscillatory signal which is locked in frequency and phase to said received data signal;
  phase control means, responsive to said second output oscillatory signal and to said received data signal for generating a phase between said second output oscillatory signal and said received data signal; and
  means for adding said first control signal and said phase error signal to generate said second control signal for said second variable frequency oscillator means.

* * * * *

UNITED STATES PATENT AND TRADEMARK OFFICE
CERTIFICATE OF CORRECTION

PATENT NO. : 5,319,680
DATED : June 7, 1994
INVENTOR(S) : Port, et. al.

It is certified that error appears in the above-indentified patent and that said Letters Patent is hereby corrected as shown below:

Column 11, line 52, after the word "means" insert --,--.

Column 12, line 35, the word "generating" should be --generated--.

Column 14, line 32, after the word "phase" insert --error signal representing the difference in phase--.

Signed and Sealed this

Thirtieth Day of August, 1994

Attest:

BRUCE LEHMAN

Attesting Officer

Commissioner of Patents and Trademarks